United States Patent
Vaiana (10) Patent No.: US 7,423,457 B2
(45) Date of Patent: Sep. 9, 2008

(54) FAST SETTLING CURRENT STEERING CIRCUIT

(75) Inventor: Michele Giovanni Vaiana, Paternò (IT)

(73) Assignee: STMicroelecronics S.r.l, Agrate Brianza (IT)

( * ) Notice: Subject to any disclaimer, the term of this patent is extended or adjusted under 35 U.S.C. 154(b) by 4 days.

(21) Appl. No.: 11/376,082

(22) Filed: Mar. 15, 2006

(65) Prior Publication Data

US 2006/0214830 A1 Sep. 28, 2006

(30) Foreign Application Priority Data

Mar. 15, 2005 (IT) .......................... VA2005A0018

(51) Int. Cl.
*H03K 5/22* (2006.01)

(52) U.S. Cl. ........................................ 327/67; 330/260

(58) Field of Classification Search .................. 327/54, 327/67; 330/258, 260
See application file for complete search history.

(56) References Cited

U.S. PATENT DOCUMENTS

| | | | | |
|---|---|---|---|---|
| 3,638,130 A * | 1/1972 | Freeborn | .................... | 330/260 |
| 4,227,095 A * | 10/1980 | Bazil | ........................... | 327/100 |
| 4,470,049 A | 9/1984 | Phaneuf et al. | ......... | 343/17.1 R |
| 4,849,662 A * | 7/1989 | Holberg et al. | .............. | 327/554 |
| 5,061,862 A * | 10/1991 | Tamagawa | .................. | 327/541 |
| 5,117,200 A * | 5/1992 | Scott, III | .................... | 330/253 |
| 5,226,014 A * | 7/1993 | McManus | ................... | 365/210 |
| 5,239,309 A | 8/1993 | Tang et al. | .................... | 342/13 |
| 5,532,628 A * | 7/1996 | Viswanathan | ................ | 327/77 |
| 5,770,968 A * | 6/1998 | Cameron | .................... | 327/538 |
| 5,804,992 A * | 9/1998 | Lee | ............... | 327/51 |
| 5,959,475 A * | 9/1999 | Zomorrodi | ................... | 327/112 |
| 6,040,732 A * | 3/2000 | Brokaw | ....................... | 327/408 |
| 6,052,026 A * | 4/2000 | Tiller et al. | ................. | 330/254 |
| 6,107,873 A * | 8/2000 | Lorenz | ....................... | 327/563 |
| 6,249,170 B1* | 6/2001 | Main et al. | .................. | 327/350 |
| 6,411,165 B1* | 6/2002 | Delano | ........................ | 330/258 |
| 6,414,536 B1* | 7/2002 | Chao | ........................... | 327/540 |
| 6,414,627 B1 | 7/2002 | McEwan | ..................... | 342/134 |
| 6,469,950 B2* | 10/2002 | Itoh et al. | .................... | 365/227 |
| 6,549,074 B2* | 4/2003 | Ugajin et al. | ............... | 330/258 |
| 6,819,144 B2* | 11/2004 | Li et al. | ......................... | 327/55 |
| 6,853,661 B2* | 2/2005 | Ekawa | .................... | 372/45.011 |
| 6,867,643 B2* | 3/2005 | Mole | ........................... | 327/561 |
| 7,071,780 B2* | 7/2006 | Van Zanten | ................. | 330/258 |
| 7,116,172 B2* | 10/2006 | Siniscalchi | .................. | 330/260 |

OTHER PUBLICATIONS

P.R. Gray and R.G. Meyer, Analysis and Design of Integrated Circuits, 2nd ed. New York: Wiley 1984, pp. 668-670.

* cited by examiner

*Primary Examiner*—Kenneth B. Wells
(74) *Attorney, Agent, or Firm*—Lisa K. Jorgenson; Allen Dyer Doppelt Milbrath & Gilchrist (57) ABSTRACT

A selector switch may be controlled by a single-ended control signal for steering a current through a load or through an auxiliary line. The selector switch may include a first terminal to be coupled to the load, and a second terminal to be connected to the auxiliary line, and two analog switches coupled to respective ones of the first and second terminals and configured to implement a single pole double throw switch so that a conduction or non-conduction state is determined by the single-ended control signal for steering the current through the load or the auxiliary line. The selector switch may also include a circuit defining a positive feedback loop controlling the two analog switches.

13 Claims, 5 Drawing Sheets

FAST SETTLING CURRENT STEERING CIRCUIT

FIELD OF THE INVENTION

This invention relates to selector switches for radar systems, and, more particularly, to a selector switch controlled by a single-ended control signal for steering a current from a load to an auxiliary path and vice versa.

BACKGROUND OF THE INVENTION

The demand of pulse radars and short-range sensors capable of detecting obstacles or levels of liquid with a resolution smaller than 0.1 m is increasing and manufacturers offer integrated radio frequency transceivers that operate in the microwave range. In a pulse radar system, short radio frequency pulses are transmitted to the antenna, are reflected by the obstacle and are then detected by the receiver. From the delay of the received echo, the distance of the target may be calculated by multiplying the speed of the light by half of the delay time.

The minimum detectable delay time equals the duration of the radio frequency pulse. As a consequence, the duration of the radio frequency pulse determines the minimum distance that the sensor may detect. Targets closer than this minimum distance would cause a superposition between the transmitted signal and the received echo signal.

Many techniques for generating very fast radio frequency pulses are available in literature. For instance, there are pulse radar systems that generate radio frequency bursts by switching on/off a high frequency oscillator that is generally realized with GaAs devices or Gunn oscillators as disclosed in U.S. Pat. Nos. 6,414,627 and 4,470,049. The oscillator is enabled for detecting the echo signal at the receiver side by controlling the input of the local oscillator either of the sampler or of the mixer.

The minimum detectable distance is determined by the switching time of the oscillator that is proportional to the attenuation time constant of the oscillator, and to the quality factor of the resonant circuit used for tuning the oscillator.

Generally, integrated radio frequency transceivers include a single reference low frequency oscillator and a PLL (Phase Locked Loop) for generating the high frequency pulse signal. In practice, the high frequency oscillator works in a continuous functioning mode and not in a discontinuous functioning mode, and the radio frequency bursts may be generated by introducing switches along the transmission path. This method has been disclosed in U.S. Pat. No. 5,239,309 by combining different spectral components of the pulse signal coming from different PLLs.

In transmissions with TDMA protocols that are largely used in wireless systems, switches are required. The so-called single-pole double-throw switches (SPDT) are largely used at the end of the transmission path. They are realized with diodes or with GaAs active devices or with CMOS devices. CMOS devices are preferred because they may not require input bias currents and have smaller costs and power consumption than the former ones.

Figure 1:
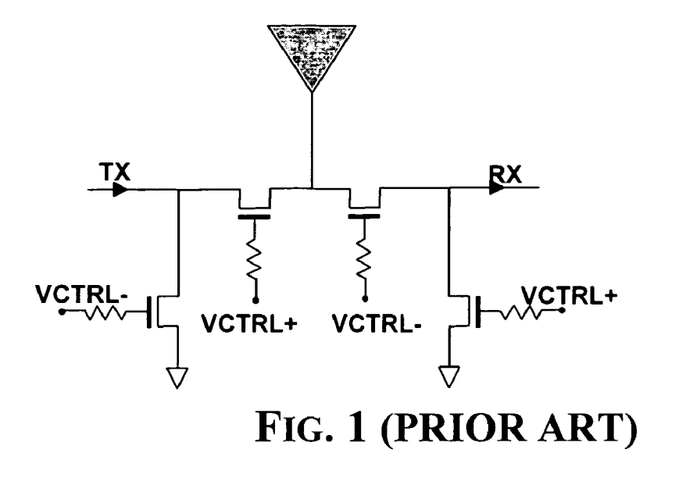
FIG. 1 shows a known SPDT switch as in the prior art.

A typical SPDT switch is shown in FIG. 1. It is controlled by the signal VCTRL that alternately connects the antenna to the TX transmission line or to the reception line RX. This switch has a low insertion loss of the signal to be transmitted when the respective switch is in a conduction state, and isolates the switch from the transmission line when the transistor is turned off. In the latter situation, the transmission line is connected to a reference potential and a strong impedance mismatch may be present.

Typically, a VCO coupled with a tuned reactive load generates an oscillating signal at a certain frequency on the transmission line. By switching the transmission line from the antenna and the reference potential, the line connected to ground functions as a reactive load in parallel to the tuned load that modifies the oscillation frequency of the VCO. Moreover, this load variation starts a transient that must be left to decay. Therefore, the pulses sent to the antenna should last at least a certain or minimum time. In addition, the selector switch of FIG. 1 needs a differential control signal and balancing this signal at high switching frequencies is not easy and typically requires a complex circuit.

Figure 2:
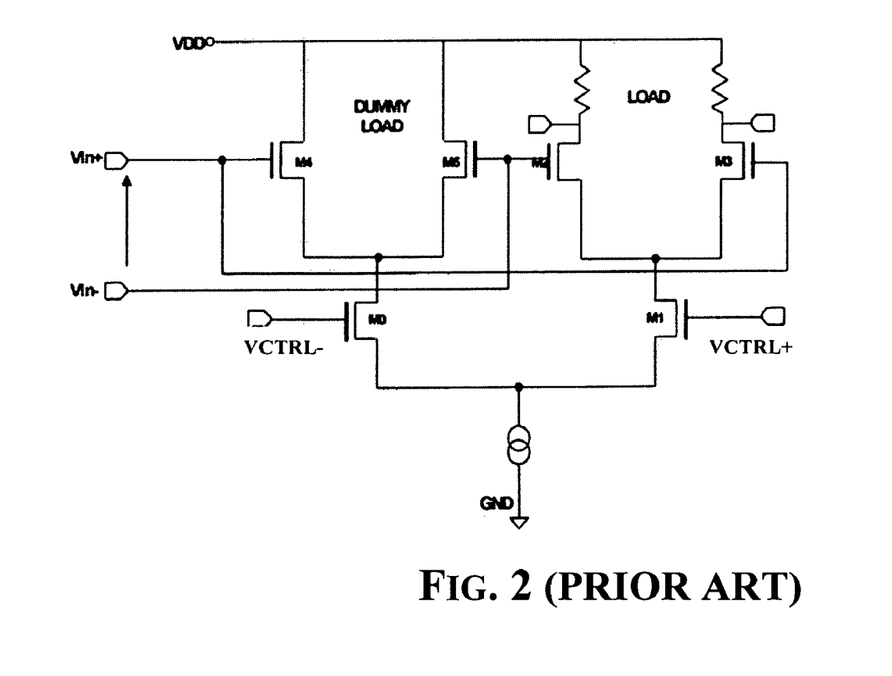
FIG. 2 shows a known SPST switch as in the prior art.

A selector switch SPST with shorter switching times, disclosed in P. R. Gray and R. G. Meyer, Analysis and Design of Integrated Circuits, 2nd ed. New York: Wiley 1984, is depicted in FIG. 2. It is inserted at the beginning of the transmission line to the antenna, symbolically represented with a differential load LOAD. The depicted selector switch transfers the differential signal VIN+, VIN− to be transmitted to the load LOAD or to a dummy line, depending on the level of the differential control signal VCTRL+, VCTRL−.

This selector switch is burdened by drawbacks due to the Miller effect that limits the speed of the response of the transistors M2 and M3 and, as a consequence, the speed of the response to the variations of the input impedance between the on state and the off state. A remedy may include installing on the auxiliary line DUMMY LOAD an impedance (not depicted in the figure) equal to the load LOAD.

Figure 3:
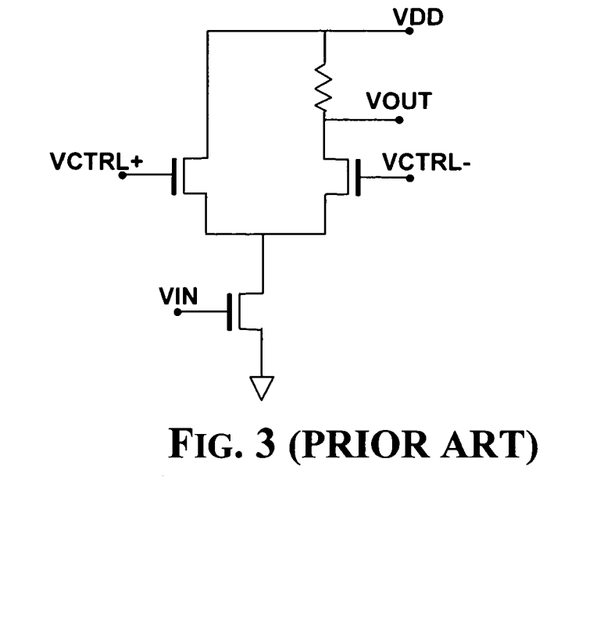
FIG. 3 show a known selector switch that uses the so-called current steering technique as in the prior art.

A generally known architecture of a selector switch that prevents variations of the input impedance seen by the local oscillator that generates the signal VIN is depicted in FIG. 3. It substantially exploits a so-called current steering technique for switching the single-ended input signal VIN on the load LOAD.

The performance of this type of selector switch is not limited by the Miller effect, because the transistors controlled by the differential control signal always see the same load whichever is the single-ended input voltage VIN.

Even in this case, a high frequency differential control signal VCTRL+, VCTRL− is necessary that is difficult to generate in a perfectly balanced manner. Moreover, switching times are determined exclusively by the pass band of the transistors of the differential pair.

SUMMARY OF THE INVENTION

The present invention provides an architecture of a very fast selector switch suitable for transferring an input signal to a load in an on/off mode. The selector switch is very simple to be realized, may be controlled by a single ended signal, and allows generating pulses at frequencies of the order of tenths of GHz.

This extraordinary result may be substantially due to the selector switch comprising a positive feedback switching stage that steers a current from a load to an auxiliary line and vice versa. Therefore, switching times are significantly reduced.

Moreover, it may not be necessary to use balanced differential control signals for driving the switches, but it is sufficient to make the single-ended control signal of the switch modify the working point as much as needed to make the feedback loop enter an unstable state. With this technique, a self-excited phenomenon begins and very rapidly increases thereby causing the switch that was off to turn on and the switch that was on to turn off.

Preferably, the positive feedback stage is realized with a differential amplifier that controls the switches and realizes with them a positive feedback loop.

BRIEF DESCRIPTION OF THE DRAWINGS

The invention will be described referring to the attached drawings, wherein.

DETAILED DESCRIPTION OF THE PREFERRED EMBODIMENTS

Figure 4:
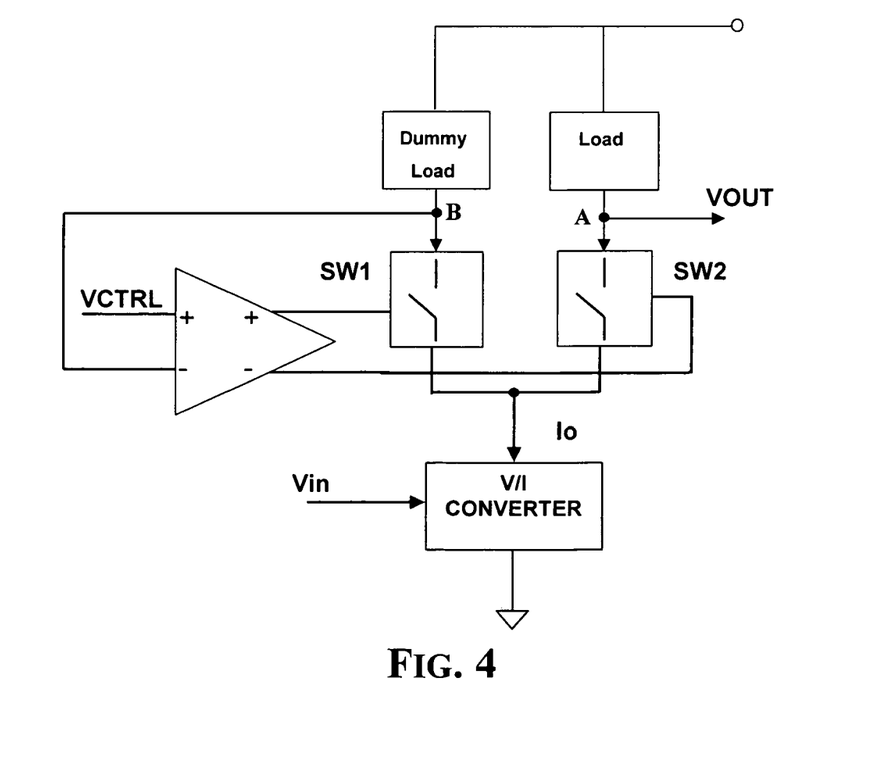
FIG. 4 shows an embodiment of the selector switch of the invention for steering the current generated by a cascode stage.

An embodiment of the selector switch of this invention is depicted in FIG. 4. It substantially comprises a pair of switches SW1 and SW2 connected to circuit means or a circuit such as to be controlled through a positive feedback loop. In the example shown in FIG. 4, this circuit comprises a differential output amplifier OA that controls both switches SW1 and SW2.

The differential amplifier OA generates on its two outputs an amplified replica of the difference between the single-ended control signal VCTRL of the selector switch and the voltage present on the terminal B of the selector switch. The output voltages of the operational amplifier OA control the switches SW1 and SW2, such that the current Io, that in the depicted example is generated by a cascode stage V/I CONVERTER controlled by a signal Vin, is steered from the terminal A to the terminal B of the selector switch and vice versa.

The selector switch works with a common single-ended control signal VCTRL, therefore it is not burdened by the stringent balance requirements of the known selector switches of FIGS. 1 to 3. In fact, the voltages on the control nodes of the switches need not be balanced, as in the prior art selector switches of FIGS. 2 and 3. As a matter of fact, it is sufficient that one of control voltages of the two switches exceeds the other for starting a positive feedback evolution. Such a self-excited evolution amplifies itself and leads to the closing of a switch and to the opening of the other switch, thus switching the current Io from the load LOAD to the auxiliary line DUMMY LOAD and vice versa.

More particularly, let us suppose that when the control voltage VCTRL exceeds the voltage on the node B to which the auxiliary line is connected, the switch SW1 is on and the switch SW2 is off. As soon as the control signal VCTRL drops below the voltage on the node B, the switch SW2 results in being controlled with a voltage larger than that of the switch SW1, thus the current flowing through SW2 is larger than the current flowing through SW1. As a consequence, the voltage on the node B increases and the switch SW2 is controlled by an even larger voltage than the voltage that controls the switch SW1. This process will reach a stable state when the voltage on the node B reaches the supply voltage of the circuit and the whole current Io circulates in the switch SW2.

Figure 5:
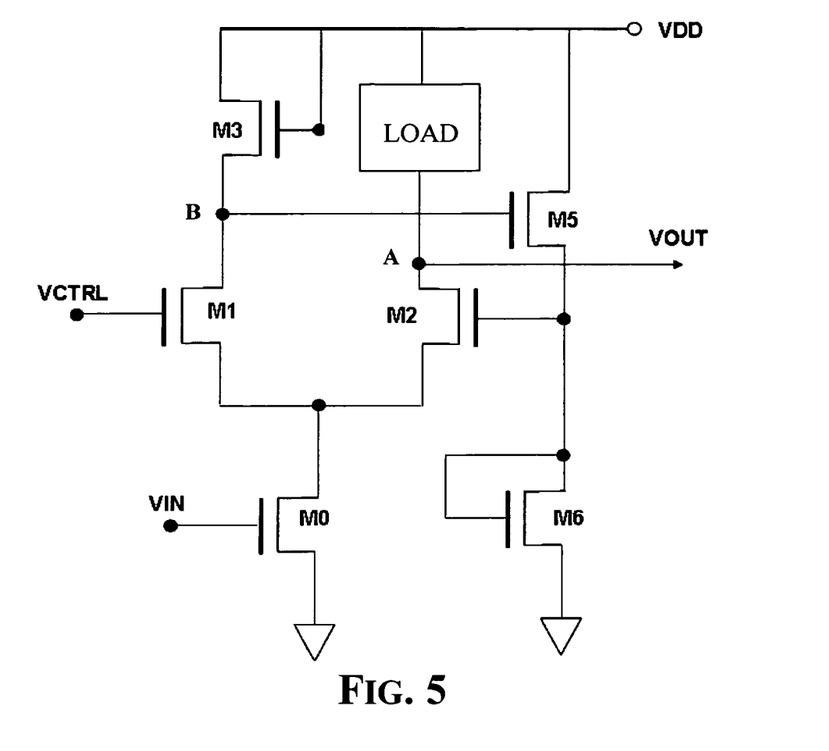
FIG. 5 shows a second embodiment of the selector switch of the invention for steering the current generated by a cascode stage.

A second embodiment of the selector switch is depicted in FIG. 5. A cascode stage M0 generates the current Io to be steered as a function of a single-ended input signal VIN. The operational amplifier OA includes the MOSFETs M5 and M6, the switches are the MOSFETs M1 and M2 and the auxiliary line DUMMY LOAD is realized with a diode-connected MOSFET M3 coupled between the output node B of the selector switch and the power supply line VDD.

When the signal VCTRL is high (e.g. equal to the supply voltage), the whole current Io flows through the switch M1. The signal applied to the buffer M5 is low because of the gate-source voltage of the active load M3. The switch M2 is open (non-conducting) and its gate voltage $V_{gM2}$ is approximately:

$$V_{gM2} = Vdd - V_{gsM3} - V_{gsM5}$$

with Vdd being the supply voltage of the switch, $V_{gsM3}$ and $V_{gsM5}$ the gate-source voltages of the MOSFETs M3 and M5.

The voltage $V_{gsM5}$ will be close to the threshold voltage of the MOSFET M5. When the control signal VCTRL decreases, the gain of the positive feedback loop increases and, when the signal VCTRL becomes closer than the voltage $V_{gM2}$, the loop gain becomes larger than 1. In this situation, the selector switch evolves rapidly to a stable state in which the switch M2 is on and the whole current Io flows through the load LOAD.

As a matter of fact, as soon as the control signal VCTRL drops below the threshold of the MOSFET M1, the transistor M1 turns off and the transistor M5 turns on, thus also the switch M2 is turned on. Optionally, as shown, the auxiliary line DUMMY LOAD may be implemented with an active load including a diode-connected MOSFET M3 coupled between the second output terminal of the switch and the supply line.

Figure 6:
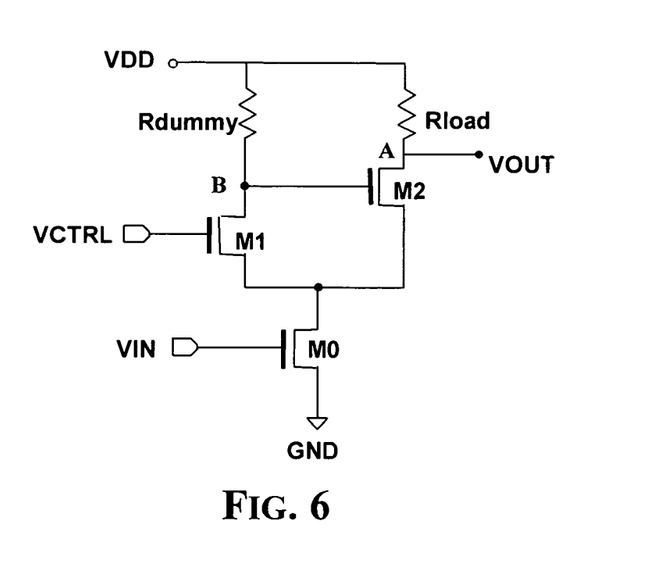
FIG. 6 shows a third embodiment of the selector switch of the invention for steering the current generated by a cascode stage.

An even simpler embodiment is shown in FIG. 6. This architecture may be derived from that of FIG. 4 by using an operational amplifier OA, the output of which tracks the input voltages on its input terminals.

By carrying out an analysis of the small-signal equivalent circuit of the circuit of FIG. 5, the gains $Av_{ON}$ and $Av_{OFF}$ for small signals of the switch are calculated respectively when the current Io flows through the load LOAD and when the current flows in the auxiliary line, that is through the active load M3.

Being gm the transconductance, Cgs the intrinsic gate-source capacitance and $\omega_{T\_M3}$, the angular transition frequency of the MOSFET M3, the following equations hold:

$$Av_{ON} = \frac{gm_{M0}}{gm_{LOAD}} \tag{1}$$

-continued $$Av_{OFF} = Av_{ON} \cdot \left| \frac{j\omega \cdot Cgs_{M5}}{gm_{M3} + j\omega \cdot Cgs_{M5}} \right| \cong Av_{ON} \cdot \frac{\omega \cdot Cgs_{M5}}{gm_{M3}} \leq Av_{ON} \cdot \frac{\omega}{\omega_{T\_M3}} \quad (2)$$

Equation (2) has been calculated supposing that the gate-source capacitance of the MOSFET M6 be negligible, and the MOSFET M5 has a channel length equal to that of the switch M2 and channel width smaller than 1/10 of the channel width of M2. The maximum gain $Av_{OFF}$ (the case of worse isolation, that allows simplifying equation 2) has been determined by supposing that the load has a high impedance.

Supposing that $$Cgs_{M5} \ll Cgs_{M3} \quad (3)$$

the ratio between the two gains $Av_{ON}$ and $Av_{OFF}$ defines the isolation of the switch, given by $$\frac{Av_{ON}}{Av_{OFF}} \geq \frac{\omega_{T\_M3}}{\omega} \quad (4)$$

Equations similar to the above may be obtained also for the switch of FIG. 6, by simply substituting the transconductances gm of the MOSFET M3 and of the load LOAD with the inverse of the resistances R<sub>LOAD</sub> and R<sub>DUMMY</sub>.

The values of the thresholds beyond which the control signal VCTRL switches M1 and M2 may be calculated by equating to 1 the open loop gains of the loop that generates the positive feedback (M1, M3, M5 and M2) as disclosed in P. R. Gray and R. G. Meyer, Analysis and Design of Integrated Circuits, 2nd ed. New York: Wiley 1984.

Figure 7:
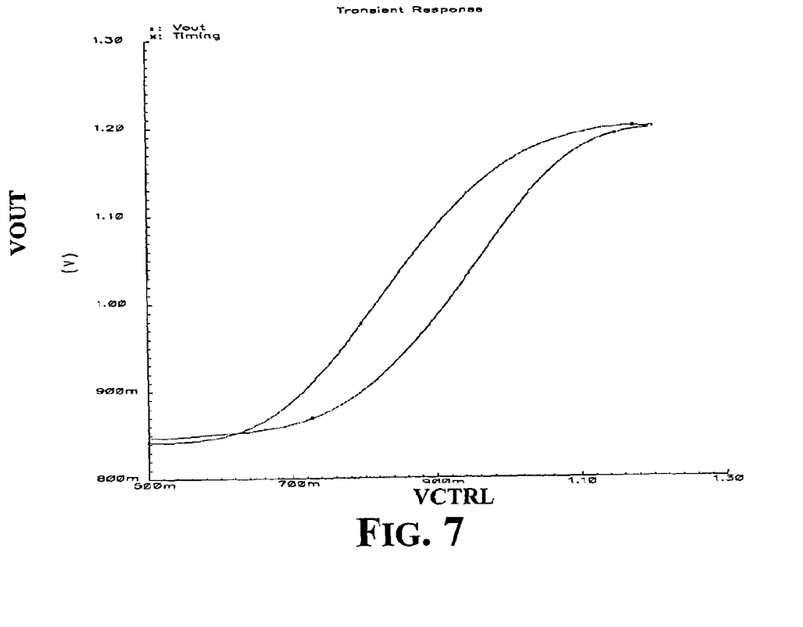
FIG. 7 is a graph of the output voltage of the selector switch of FIG. 5 as a function of the control voltage VCTRL.
Figure 8:
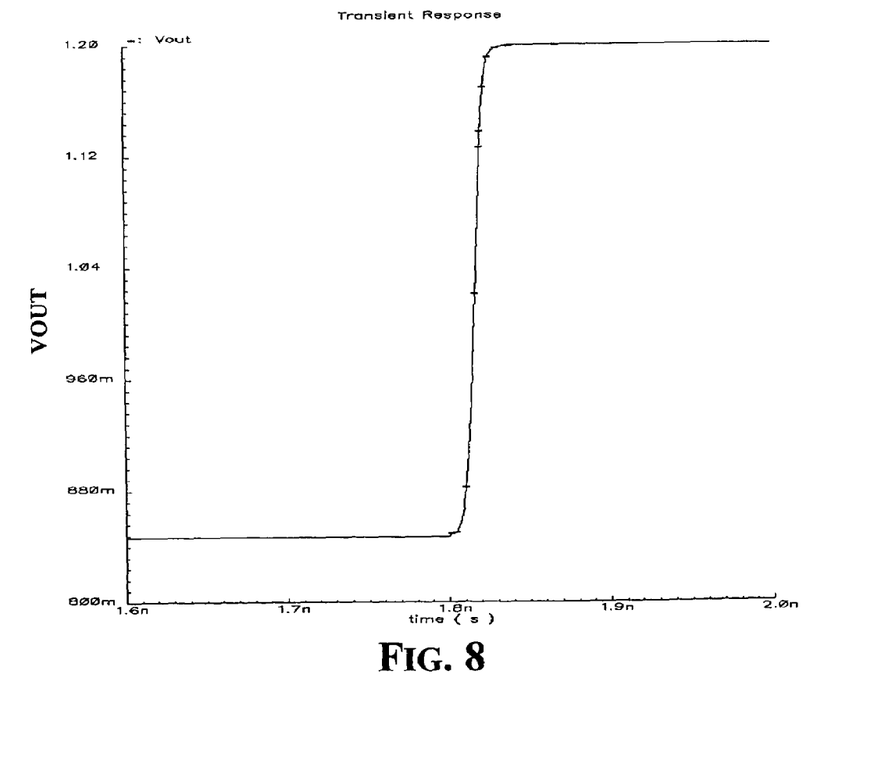
FIG. 8 is a possible time graph of the output voltage of the selector switch of FIG. 5 following a step variation of the control voltage VCTRL.

The results of the simulations of the functioning of the selector switch of FIG. 6 are shown in FIGS. 7 and 8, by supposing that the switches M1 and M2 are realized in a 90 nm CMOS technology with an aspect ratio of 50 μm/0.09 μm, with a transition frequency of about 90 GHz, a gain $Av_{ON}$ of 0 dB and isolation of about 30 dB at a working frequency of about 8 GHz.

FIG. 7 shows that the voltage VOUT on the load LOAD describes a hysteresis loop as a function of the signal VCTRL, while FIG. 8 shows that the selector switch of this invention of FIG. 6 responds to a step variation of the signal VCTRL in times of the order of a tenth of picoseconds.

Figure 9:
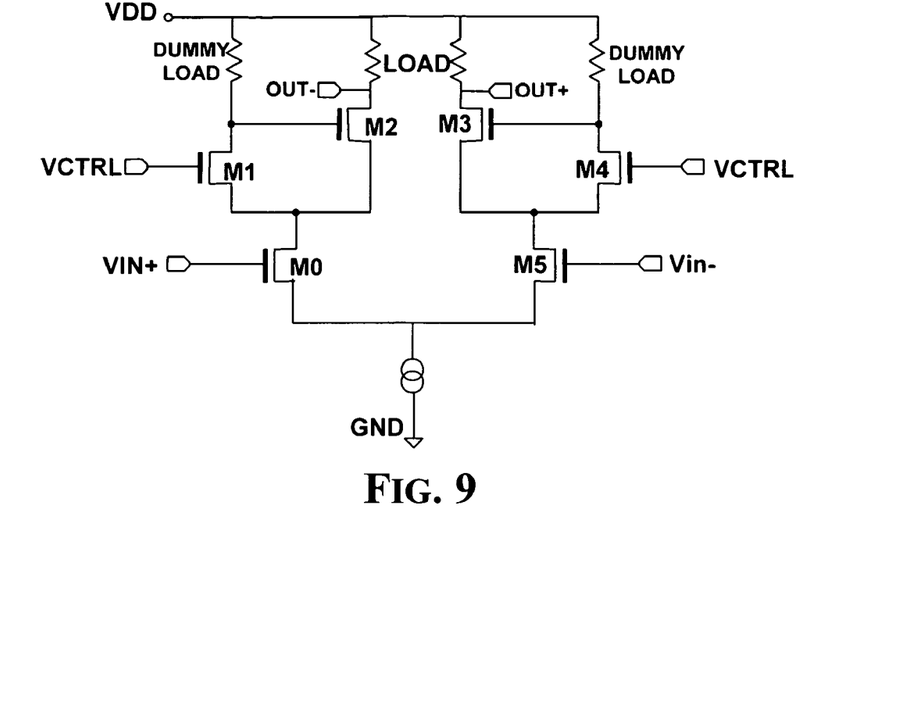
FIG. 9 shows a differential switching device of this invention including two selector switches of FIG. 6.
Figure 10:
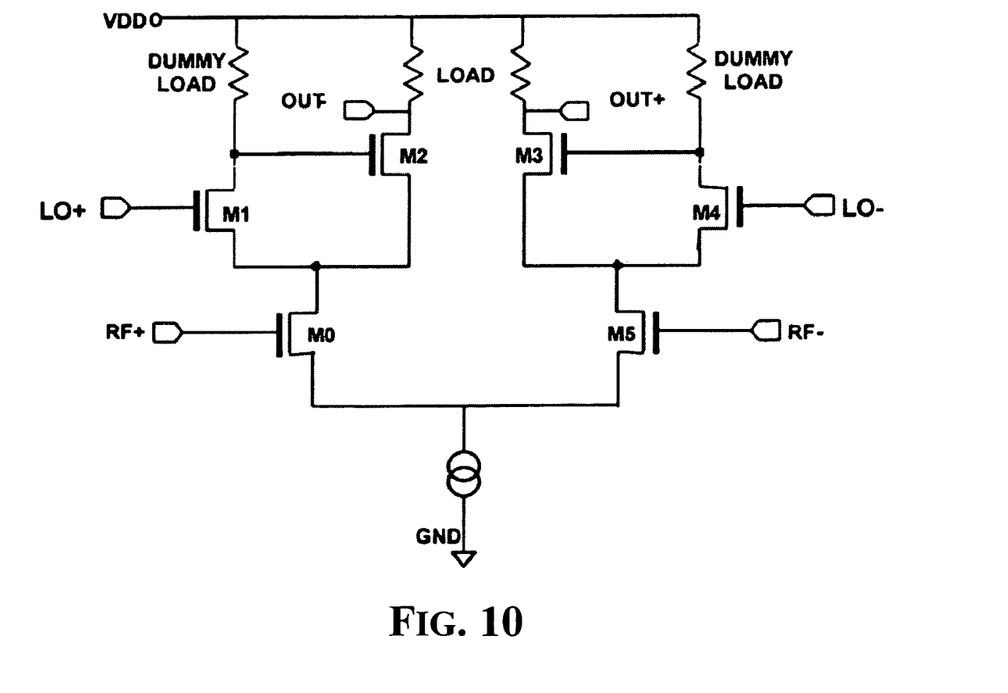
FIG. 10 shows a mixer of this invention that employs two selector switches of FIG. 6.

Two identical selector switches may be used for realizing a device for switching a differential input signal VIN+, VIN− on a load LOAD shown in FIG. 9 and a mixer that generates a differential output signal by frequency modulating and amplifying a differential input signal RF+, RF− shown in FIG. 10.

The functioning of these two devices is not described in detail because it would be readily appreciated by those skilled in the art in view of what has been stated referring to the selector switches of FIGS. 5 and 6.

Though embodiments in MOS technology have been described, embodiments in bipolar technology may be immediately obtained by substituting the MOSFETs in FIGS. 5, 6, 9 and 10 with BJTs. Similarly, loads on the auxiliary path may be diode-connected transistors and/or impedances.

That which is claimed is:

1. A selector switch to be controlled by a single-ended control signal for steering a current through a load or through an auxiliary line, the selector switch comprising:

a first terminal to be coupled to the load, and a second terminal to be coupled to the auxiliary line;
respective analog switches coupled to said first and second terminals and configured to implement a single pole double throw switch so that a conduction state or a non-conduction state is determined by the single-ended control signal for steering the current through the load or the auxiliary line;
a differential output amplifier defining a positive feedback loop controlling said analog switches by amplifying a difference between the single-ended control signal and a voltage at said second terminal, and providing amplified differential voltages to said respective analog switches; and
a cascode stage generating the current as a function of an input single-ended signal.

2. The selector switch of claim 1, wherein said analog switch coupled to said second terminal has a control node coupled to the single-ended control voltage; and wherein said circuit further comprises a differential amplifier having an output coupled to a control node of said analog switch coupled to said first terminal.

3. The selector switch of claim 1 wherein the auxiliary line comprises a dummy impedance coupled between said second terminal and a supply line.

4. The selector switch of claim 1 wherein said circuit comprises a control path for said analog switch coupled to said first terminal, said control path being coupled between a supply line and a common reference node.

5. The selector switch of claim 4, wherein said control path comprises a transistor and an active load coupled in series therewith between the supply line and the common reference node; and wherein said analog switch coupled to said first terminal is controlled by a voltage on a common node between said active load and said transistor.

6. A selector switch to be controlled by a control signal for steering a current through a load or through an auxiliary line, the selector switch comprising:

a first terminal to be coupled to the load, and a second terminal to be coupled to the auxiliary line;
respective analog switches coupled to said first and second terminals and configured so that a conduction state or a non-conduction state is determined by the control signal for steering the current through the load or the auxiliary line;
a differential output amplifier controlling said analog switches by amplifying a difference between the control signal and a voltage at said second terminal, and providing amplified differential voltages to said respective analog switches; and
a cascode stage generating the current as a function of an input single-ended signal.

7. The selector switch of claim 6, wherein the auxiliary line comprises a dummy impedance coupled between said second terminal and a supply line.

8. The selector switch of claim 6 wherein the control signal comprises a single-ended control signal.

9. The selector switch of claim 6, wherein said analog switch coupled to said second terminal has a control node coupled to the control voltage; and wherein said circuit further comprises a differential amplifier having an output coupled to a control node of said analog switch coupled to said first terminal.

10. The selector switch of claim 6, wherein said circuit comprises a control path for said analog switch coupled to said first terminal, said control path being coupled between a supply line and a common reference node.

11. A method for making a selector switch to be controlled by a control signal for steering a current through a load or through an auxiliary line, the method comprising:

providing a first terminal to be coupled to the load, and a second terminal to be coupled to the auxiliary line;

coupling respective analog switches to the first and second terminals and configured so that a conduction state or a non-conduction state is determined by the control signal for steering the current through the load or the auxiliary line;

coupling a differential output amplifier for a difference between the control signal and a voltage on the second terminal, and for generating amplified differential voltages to respective analog switches; and coupling a cascode stage generating the current as a function of an input single-ended signal.

12. The method of claim 11, wherein the control signal comprises a single-ended control signal.

13. The method of claim 11 wherein the analog switch coupled to the second terminal has a control node coupled to the control voltage; and wherein said circuit further comprises a differential amplifier having an output coupled to a control node of the analog switch coupled to the first terminal.

* * * * *

UNITED STATES PATENT AND TRADEMARK OFFICE
CERTIFICATE OF CORRECTION

PATENT NO. : 7,423,457 B2
APPLICATION NO. : 11/376082
DATED : September 9, 2008
INVENTOR(S) : Vaiana

Page 1 of 1

It is certified that error appears in the above-identified patent and that said Letters Patent is hereby corrected as shown below:

Cover Page, Section 73     Delete: "STMicroelecronics S.r.l,"
Insert: -- STMicroelectronics S.r.l., --

Signed and Sealed this

Seventeenth Day of March, 2009

JOHN DOLL
*Acting Director of the United States Patent and Trademark Office*